US006837974B2

(12) United States Patent
Lawson et al.

(10) Patent No.: US 6,837,974 B2
(45) Date of Patent: Jan. 4, 2005

(54) SINGLE PIECE POD SHIELD FOR VERTICAL PLENUM WAFER PROCESSING MACHINE

(75) Inventors: John Lawson, Chandler, AZ (US); Dale Irwin, Mesa, AZ (US); Steve Chervenak, Gold Canyon, AZ (US)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 10/349,661

(22) Filed: Jan. 23, 2003

(65) Prior Publication Data

US 2003/0146085 A1 Aug. 7, 2003

Related U.S. Application Data

(60) Provisional application No. 60/353,340, filed on Feb. 1, 2002.

(51) Int. Cl.[7] ................................................ C23C 14/34
(52) U.S. Cl. .............................. 204/298.11; 204/192.12; 204/298.28
(58) Field of Search ........................ 204/192.12, 298.11, 204/298.28

(56) References Cited

U.S. PATENT DOCUMENTS

| 4,909,695 A | 3/1990 | Hurwitt et al. ............. 414/217 |
| 4,915,564 A | 4/1990 | Eror et al. .................. 414/217 |
| 5,516,732 A | 5/1996 | Flegal ........................ 437/250 |
| 5,658,442 A | * 8/1997 | Van Gogh et al. ...... 204/298.12 |
| 5,820,329 A | 10/1998 | Derbinski et al. ........... 414/225 |
| 6,143,147 A | 11/2000 | Jelinek ................... 204/298.15 |
| 6,258,228 B1 | 7/2001 | Reiss ..................... 204/298.15 |
| 6,645,357 B2 | * 11/2003 | Powell .................. 204/298.11 |

OTHER PUBLICATIONS

Publication No. US 2002/0064450 A1. *Coomer et al.,* Pub. Date: May 30, 2002.

* cited by examiner

*Primary Examiner*—Steven Versteeg
(74) *Attorney, Agent, or Firm*—Wood, Herron & Evans, L.L.P.

(57) ABSTRACT

A replacement chamber shield is provided for a wafer processing machine that replaces many prior art shield components with a single piece shield. The shield is particularly suitable for use in a processing chamber of a vacuum processing machine of a type for processing a wafer in a vertically-oriented split-plenum, such as machines of the type described in U.S. Pat. Nos. 4,909,695 and 4,915,564 and the machine marketed under the trademark ECLIPSE MARK II by Tokyo Electron Limited. The shield is formed of sheet material formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter. Advantageous dimensions and geometric relationships to components of the machine are described and claimed.

20 Claims, 5 Drawing Sheets

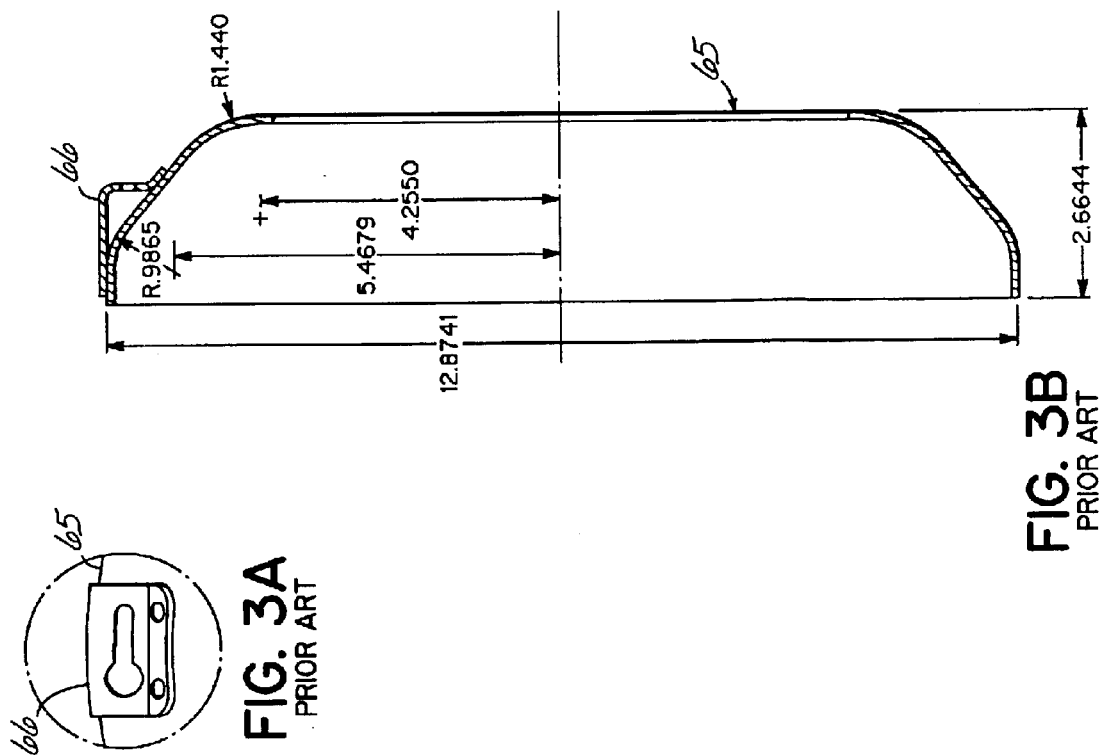
FIG. 3A PRIOR ART
FIG. 3B PRIOR ART
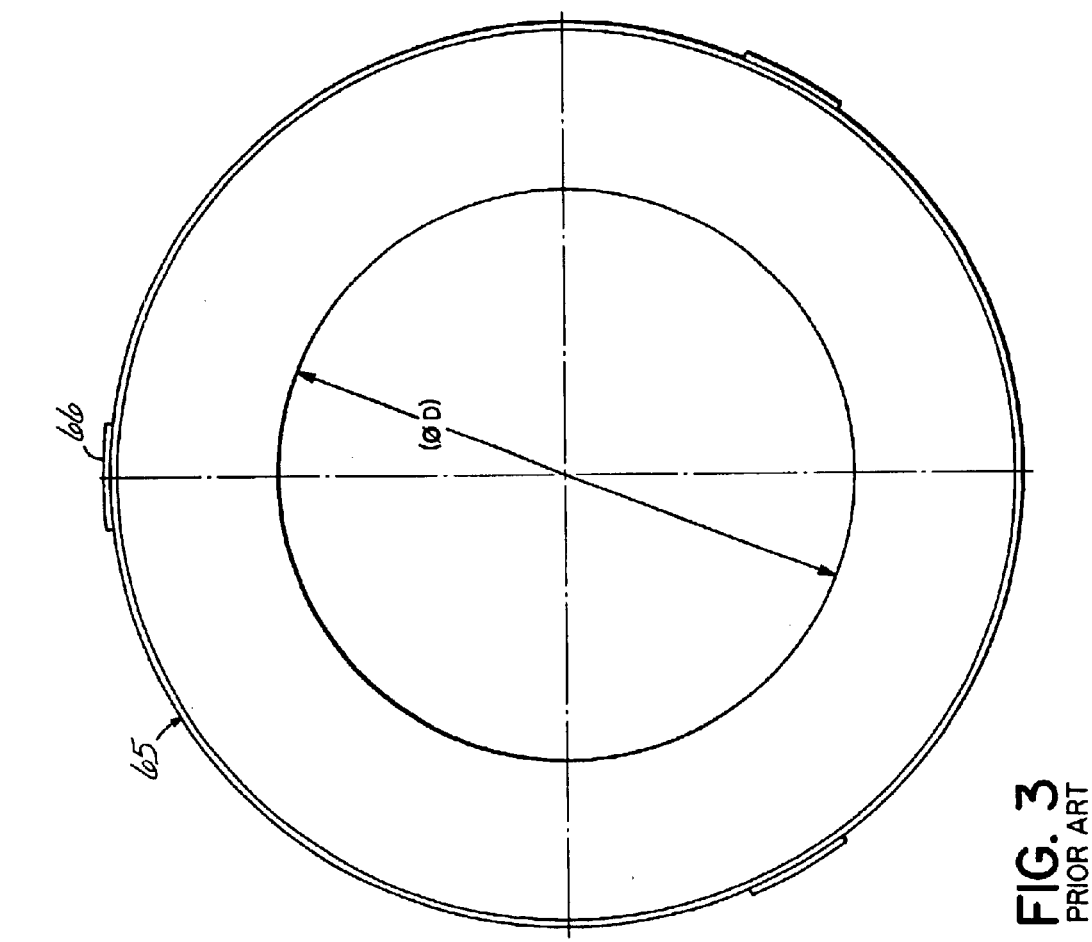
FIG. 3 PRIOR ART

SINGLE PIECE POD SHIELD FOR VERTICAL PLENUM WAFER PROCESSING MACHINE

This application claims priority to U.S. Provisional Application Ser. No. 60/353,340, filed Feb. 1, 2002, hereby expressly incorporated herein by reference.

FIELD OF THE INVENTION

This application relates to chamber shields for wafer processing machines of the type described in U.S. Pat. Nos. 4,909,695 and 4,915,564, both hereby expressly i corporated herein by reference, and of the types described in U.S. Pat. No. 5,516,732 and U.S. patent application Ser. No. 09/725,823, both also hereby expressly incorporated herein by reference. Details of structure within chambers of such machines are also described in U.S. Pat. Nos. 5,820,329, 6,143,147 and 6,258,228, each also hereby expressly incorporated herein by reference. A machine of this type has been marketed under the trademark ECLIPSE MARK II by Applicant's assignee, Tokyo Electron Limited. This application particularly relates to shield used in sputtering chambers of such machines, particularly in sputter deposition chambers, to shield chamber walls and other structures around the perimeters of wafers being processed in such chambers.

BACKGROUND OF THE INVENTION

Sputtering equipment that is used to manufacture semiconductors and other data processing and storage devices includes one or more vacuum processing chambers in which a substrate is supported for processing. For sputter coating processes, a target of sputter coating material from which material is sputtered is placed in the chamber, in which a plasma is created to supply ions of gas which sputter the material from the target. While the objective is to form a film on the substrate of the sputtered material, material also coats the surfaces of chamber walls and other structures in contact with the volume of the chamber. These coatings must be periodically removed or they will eventually flake off and contaminate substrates being processed in the chamber or interfere with the operation of the equipment.

Cleaning of the fixed components of the processing chamber is time consuming, requiring the equipment to be shut down, and subtracting from the productivity of the equipment. To minimize these shut-downs, removable shields are provided in the chamber to intercept coating material from alighting on the walls and other chamber components. These shields can be removed and replaced, or cleaned and reused, thereby enabling the machines to be returned to production in less time. Such shields can be fabricated from different materials, and are often made of aluminum or stainless steel.

The complicated structure of processing chambers has resulted in the chamber shields being made in a number of parts. Process considerations such as coating film uniformity on the substrate and process parameters such as gas flow, electric and magnetic field shapes and sputtering geometry have affected the designs of the individual shield components. As a result, the number and shapes of the chamber shields have added to the removal and replacement times for the shields and limited the productivity savings that the shields provide. In addition to contributing to the down-time of the machine that is needed to change chamber shields, replacements for complex shield systems are expensive and, in addition to the loss of valuable production time, add to the machine's maintenance costs.

High speed processing machines such as those of the vertical, split-plenum type, in which the processing chambers are formed in two halves on opposite sides of a rotating, index-wheel or index-plate, multiple-wafer holder, impose additional difficulties on the designs of chamber shields. The complexities that result from the configuration of these machines is apparent from the designs of these chambers, as illustrated, for example, in FIGS. 1, 17–19 and 22 of U.S. Pat. No. 4,915,564; FIGS. 1 and 3 of U.S. Pat. No. 5,820,329; and FIG. 5 of U.S. Pat. No. 6,258,228, which are incorporated by reference above.

The index wheel or plate of the machines described in these patents includes typically five wafer holders spaced at equal angular intervals around the center of the index plate, which rotates in a vertical plane around a horizontal axis through the center of the plate. The rotation of the plate indexes the wafer holders among five stations, one of which is a load lock and the other four of which are processing stations. Typically three of these stations include sputter deposition chambers. Another of the chambers is typically a sputter etch chamber. The chambers are formed by the movement toward each other of a pair of cup-shaped members that clamp against a seal ring in the center of which a wafer holder is mounted, and form a split processing chamber on the opposite sides of the wafer holder. The stations of the machine at which the processing chambers are so formed are referred to as pods. Each of the pods that contain one of the processing chambers is provided with a chamber shield system.

FIG. 2 of the present application illustrates approximately a dozen shield components of a prior art shield system required to shield each sputter coating chamber of the apparatus described in the patents referred to above. FIGS. 3, 3A and 3B are cross-sectional views of a two-part funnel-shaped prior art shield that has been used to replace the wafer-holder shield and other components of the shield system of FIG. 2, reducing the total number of shield components.

There remains a need to improve the chamber shielding in vertical split-plenum type processing machines, to reduce the cost of the replaceable chamber shields for such machines, and to shorten the time needed to replace the chamber shields.

SUMMARY OF THE INVENTION

An objective of the present invention is to provide a replacement, reusable or disposable metal shield that provides protective shielding of parts of a sputtering apparatus, and in particular, of a sputtering apparatus of the type referred to under the 'Field of the Inventions' section of this application above.

A particular objective of the invention is to provide chamber shields for a sputtering apparatus that will reduce the overall cost of operation of the machine.

Another objective of the invention is to provide a chamber shield for a sputtering apparatus that facilitates optimal performance of the process being performed in the sputtering apparatus.

According to principles of the present invention, a single-piece chamber or pod shield is provided that replaces many components of the chamber shields of the prior art. Shields according to embodiments of the present invention are particularly configured and dimensioned to facilitate the installation, removal and changing of the shield while optimizing the performance of sputtering processes in a sputtering apparatus, particularly an apparatus of the vertical split-plenum type.

In the illustrated embodiment of the invention, a machine is shown having a plurality of chambers bounded by a pod chamber wall that forms a well in which a target assembly is situated at an adjustable target-to-substrate spacing. The substrate is positioned in a holder spaced beyond an opening in the pod chamber wall at the end of the well opposite the target, where it is held to the holder by a clamp ring spaced a predetermined distance beyond the bottom of the well when the chamber is sealed and a wafer is positioned for processing.

Preferably, the shield is a single piece chamber shield for a split processing chamber of a vertical plenum wafer processing machine that is formed of an integral piece of material formed into a cylindrical sidewall that smoothly transitions into a radial annular shoulder that transitions into a further cylindrical section or frusto-conical taper that, in turn, transitions into a radial annular disc having a central circular opening that is larger in diameter than the wafer being processed. The preferred overall height of the shield is greater than the target-to-substrate spacing. The maximum diameter of the shield is 13.188 inches, preferably +0.000/−0.010 inches. The inside diameter of the cylindrical sidewall of the shield is more than 13 inches. This provides clearance for the target, with the shield installed, that is sufficient to allow adequate clearance when the hinged door swings and carries the target and its adapter into and out of the pod chamber wall, for example, 0.094 inches. The shield cylindrical sidewall, when installed, is at least 0.032 from the sidewall of the pod chamber wall.

The height of the cylindrical wall of the shield is dependent on the required target-to-substrate spacing, which can range from 2.5 to 2.0 to 1.7 inches. The preferred height of the cylindrical sidewall of the shield can vary from not more than 2.12+0.00/−0.02 inches to not less than 1.3+0.00/−0.02 inches. The shield has an annular radial shoulder that is planer and has in inside diameter of not more than 11.08 inches. The shield further has an inner central section that extends beyond the plane of the shoulder by not more than 0.67 inches, preferably by 0.65 inches +/−0.02 inches. The depth of the central section the plane of the shoulder should be less than 0.7 inches. The shield, when so installed, maintains a spacing of 0.108 inches, +/−0.025 inches, from the wafer holder clamp ring to the shield, when the seal ring to which the wafer holder is mounted is clamped against the pod chamber wall.

With the target-to-substrate spacing at 2.5 inches, a circular opening at the center of the shield has a preferred diameter of 5.591+/−0.005 inches for 100 mm wafers, 6.575+/−0.005 for 125 mm wafers, and 7.560+/−0.005 inches for 150 mm wafers, which may vary depending on process variables. For these wafer sizes, the circular opening at the center of the shield has a diameter of approximately 1¼ to 1½ inches larger than the corresponding opening in the wafer-holder shield of the prior art, or approximately 20 to 25 percent larger than the corresponding opening in the wafer-holder shield of the prior art.

The shield may be provided with a plurality of vent holes or slots that may be configured in a way that line-of-sight paths through the shield are restricted. The slots are preferably located within a 90° quadrant of the cylindrical sidewall that faces the axis of the index plate of the apparatus. Thickness of the material is preferably 0.070 inches +/−0.010 inches. The shield is installed in machines of the type described above such that a single-piece chamber shield replaces at least two components of the prior art shield, and specifically, the pod shield, the gate valve shield, two corner shields, the cathode adapter shield, the spacer ring, and the wafer holder shield thereof.

These and other objectives of the present invention are more readily apparent from the following detailed description of the drawings.

BRIEF DESCRIPTION OF THE DRAWINGS

FIGS. 3, 3A and 3B are illustrations of a portion of a shield system of the prior art that is an improvement over that of FIG. 2.

DETAILED DESCRIPTION OF THE ILLUSTRATED EMBODIMENTS OF THE INVENTION

Figure 1:
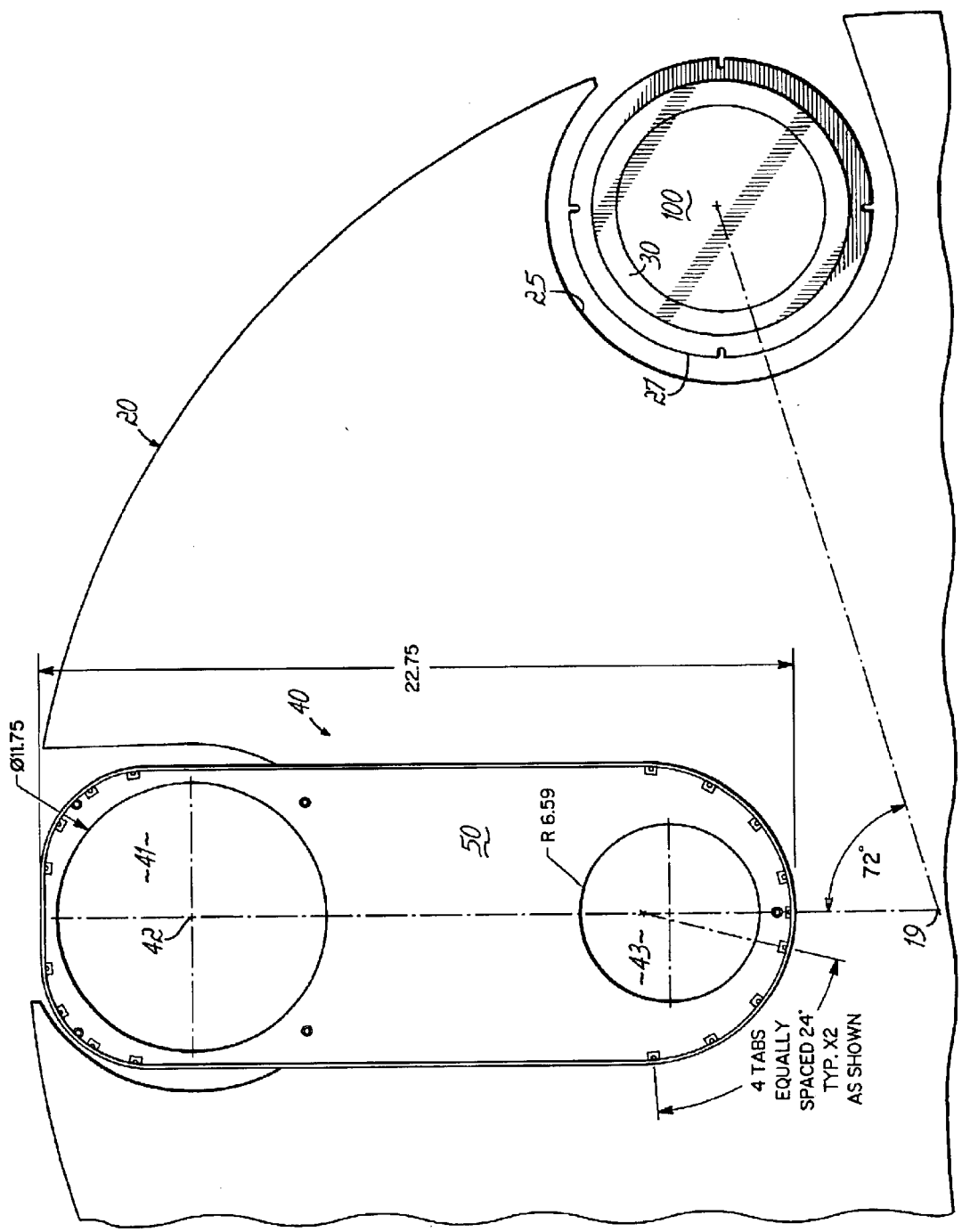
FIG. 1 is a side view of a section of a vertical split-plenum processing apparatus of the prior art illustrating the location of a pod and pod shield.

In FIG. 1, a portion of a sputter processing apparatus 10 of the prior art is illustrated, showing an index plate 20, similar to the plate 20 of U.S. Pat. No. 5,820,329, in relation to a chamber-shield system 40. The plate 20 rotates about its axis 19 and has five wafer-holder openings 25 therein equally spaced around the axis 19 and in each of which is resiliently mounted a sealing ring 27 to which is mounted a wafer holder 30 that supports a wafer 100 for processing. The shield system 40 has components centered on the centerline 42 of a processing chamber 41 and components that are extend to and around a gate valve opening 43 to a vacuum pumping system (not shown). One of the five wafer holders 30, which is not shown, is centered on the centerline 42 of the chamber 41. A second one of the five holders 30 is illustrated spaced 72° about the axis 19 from the chamber 41, where it is centered at either another processing station or a load lock station, which is omitted from the illustration for simplicity.

Figure 2:
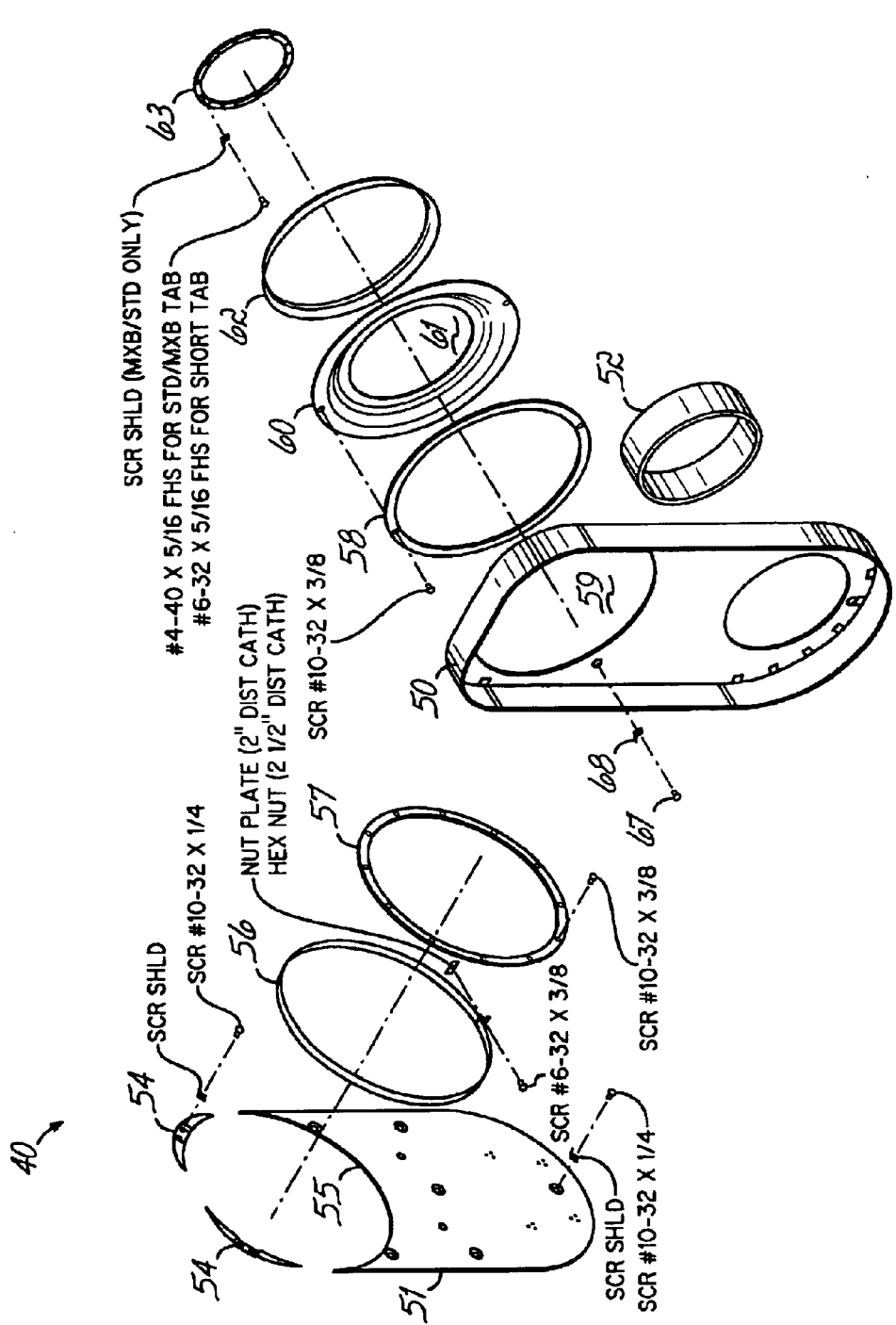
FIG. 2 is an exploded perspective view illustrating the prior art pod shield system of FIG. 1.

The shield system 40 includes, as illustrated in more detail in FIG. 2, a pod shield 50 and a door shield 51 that generally enclose the processing chamber 41 and the gate valve opening 43, and protect the index plate 20 and the walls of the plenum in which the plate 20 rotates from deposition. The shield system 40 also includes a gate valve shield 52 that interconnects the gate valve opening 43 in the pod shield 50 and a pump opening in the plenum wall (not shown) to protect the walls of passages leading to the pump from deposition. A pair of corner shields 54 are provided approximately in the plane of the door shield 51 that are arranged in relation to a cutout 55 in the door shield 51.

Figure 5:
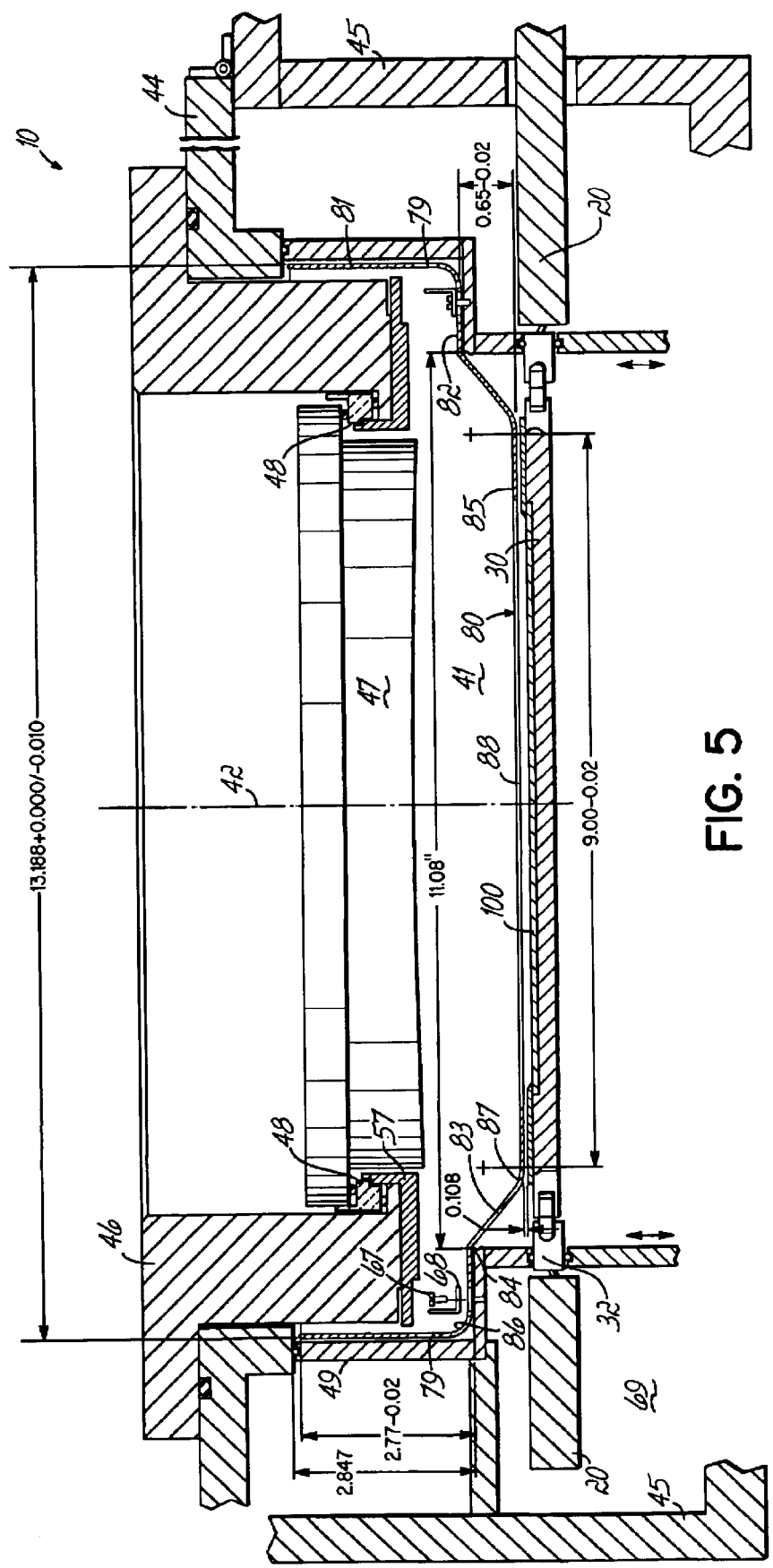
FIG. 5 is a cross-sectional view, similar to FIG. 5 of U.S. Pat. No. 6,258,228, along line 5-5 of FIG. 4, illustrating a single-piece shield according to principles of the present invention, and illustrating certain preferred dimensions of the single-piece shield and relationships between the shield and other structures at the pod.

FIG. 5, while illustrating features of the invention, shows additional elements of the permanent structure of the machine 10, which has a target access door 44 hinged to the housing 45 of the apparatus 10. A pod wall 49 that forms a stationary portion of the wall of the chamber 41 is fixed to the housing 45 through structure not shown. A cutout 55 of the door shield 51 and the corner shields 54 (FIG. 2) surround the pod wall 49 for this door. The door 44, when closed, seals against the rim of the pod housing 49. A ring-shaped target adapter 46 is fixed to the inside of the door 44 and supports a sputtering target 47 on the door 44 on insulators 48 such that the target 47 is electrically insulated from the door 44 and chamber wall 45. The adapter 46 has a predetermined outside diameter but has an inside diameter that will differ depending on the size of the sputtering target 47. In FIG. 5, the sputtering target 47 has a twelve inch outside diameter. Not shown is a target-to-substrate spacing adjustment system that permits the adjustment of the target 47 directly toward and away from the door 44, as process parameters require. The pod shield 50 is mounted to the wall 49 by four screws 67 equally spaced at 90° intervals on a circle of 12.25 inches in diameter. Each of the screws 67 is provided further with a screw shield 68.

A shield system 40 further includes a cathode adapter shield 56 that aligns with the cutout 55 and the corner shields 54 (FIG. 2), which, when mounted in the chamber, is spaced from the outside diameter of the target adapter 46 (FIG. 5). A dark space shield 57 is provided on the target adapter 46. A spacer ring 58 surrounds an opening 59 in the pod shield 50, which aligns with a wafer holder shield 60 that is supported on the pod chamber wall 49. The wafer holder shield 60 has a hole 61 therein, in which a substrate 100 (FIG. 1) is to be centered for processing. The diameter of the hole 61 differs depending on the diameter of the wafers 100 being processed. For 100 millimeter (mm) wafers, the hole 61 is 4.17 inches in diameter; for 125 mm wafers, it is 5.16 inches in diameter; for 150 mm wafers, it is 6.14 inches in diameter; and for 200 mm wafers, it is 8.11 inches in diameter. All of the elements 50-61 of the shield system 40 are located on the target side of the index plate 20. The shield system 40 also includes a plenum shield 62 and a heater shield 63 that are mounted on a backplane side 69 of the index plate 20, which is the side opposite the target 47.

As an alternative to the shield system 40 of the prior art discussed above, a funnel shield 65 has been provided in the prior art, which replaces, or renders unnecessary, the pod shield 50 and the gate valve shield 52 of FIG. 2. The funnel shield 65 is illustrated in FIGS. 3, 3A and 3B, and is mounted on the housing 45 by three bayonet keyway tabs 66 to an adapter ring (not shown) that is supported by the four screws 67 to the housing 45.

Figure 4:
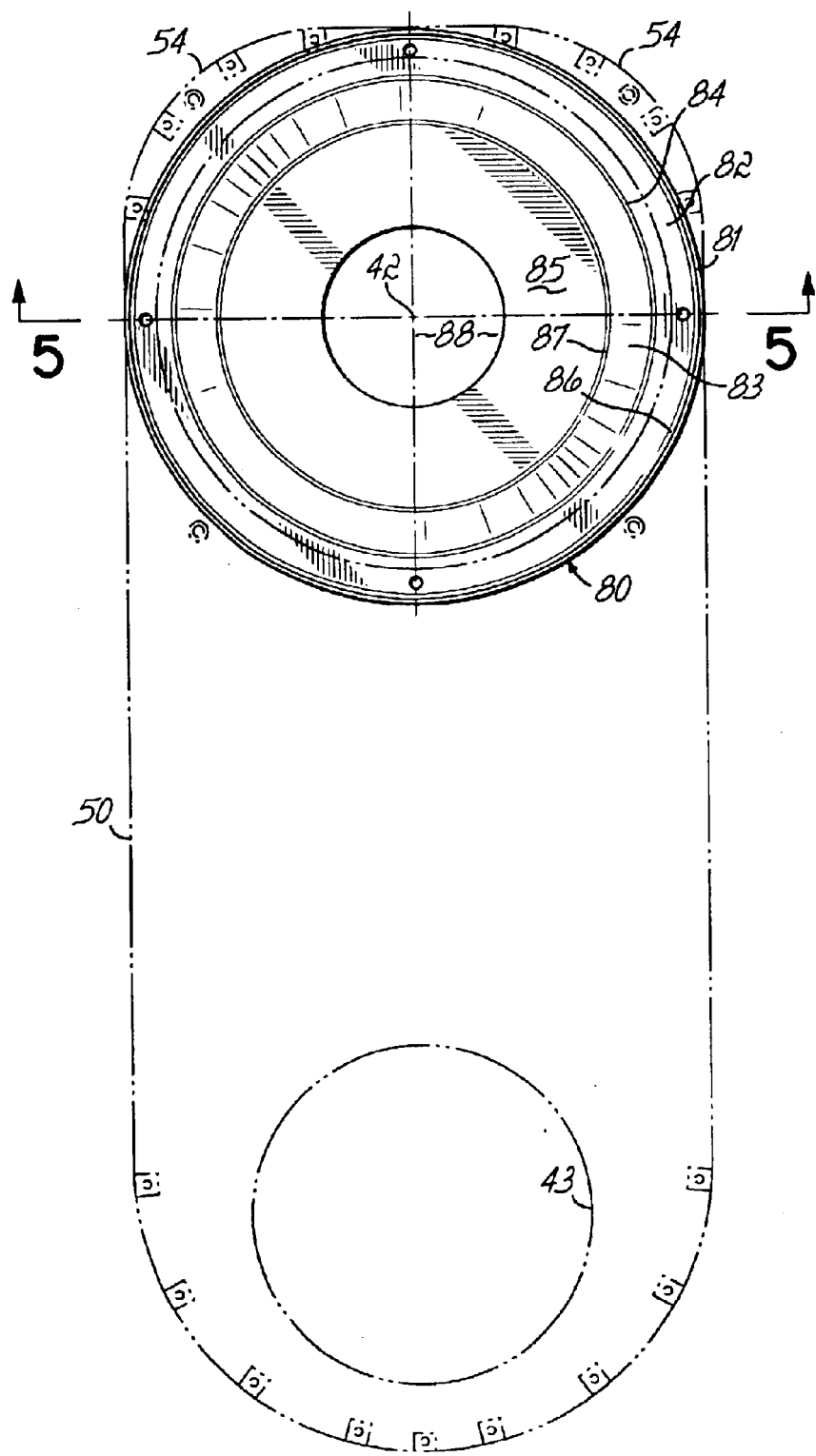
FIG. 4 is a side view, similar to FIG. 1, of a section or pod of a vertical split-plenum processing apparatus with one embodiment of a shield according to principles of the present invention.

A chamber shield that embodies principles of the present invention is a single-piece chamber shield 80, illustrated in FIG. 4, which is mounted to the pod chamber wall 49 by screws 67, as illustrated in FIG. 5. The single-piece chamber shield 80 replaces the pod shield 50 (the position of which is shown in phantom in FIG. 4), the gate valve shield 52, the corner shields 54, the cathode adapter shield 56, the spacer ring 58 and the wafer holder shield 60 of FIG. 2. In addition to replacing these components of the shield system 40 and thereby providing the advantages and solving the problems discussed above, the single-piece chamber shield 80 is provided with a configuration that produces an optimal effect on process conditions and parameters. It has been found, for example, that certain configurations and dimensions, if maintained for the chamber pod shield 80, produce optimum uniformity on the wafer 100. Such dimensions should therefore be accurately maintained.

Referring to FIGS. 4 and 5, the illustrated embodiment of a chamber shield 80 according to the present invention is preferably formed of a single piece of metal, typically aluminum or stainless steel, and is of uniform thickness. A thickness of 0.070 inches +/−0.010 inches is preferred. The shield 80 is formed with a cylindrical sidewall section 81 having a diameter that brings the shield 80, when installed in the chamber 41, to be spaced a small distance from the pod chamber wall 49 where it forms the cylindrical peripheral wall of the chamber 41, but does not touch it. A design distance of 0.032 inches is preferred. For the chamber of the ECLIPSE MARK II machine referred to above, the cylindrical sidewall 81 of the shield 80 has a maximum diameter of 13.188 inches, with tolerances of +0.000 inches and −0.010 inches, where the material is of the thickness referred to above. Varying of the thickness can accommodate a corresponding change in the maximum shield diameter to preserve one or more minimum clearances with adjacent components. The inside diameter of the sidewall 81 is more than 13 inches This provides a clearance for the target 47 that is within the target adapter ring 46 that is sufficient to allow adequate clearance when the hinged door 44 swings and carries the target 47 and adapter 46 into and out of the pod chamber wall, for example of 0.094 inches, thereby avoiding contacting the inside of the shield sidewall 81 by the target assembly. These clearances are particularly suitable for maintaining gas flow and other process parameters that can affect the quality of the process performed on the wafer.

In the machine 10, the cylindrical wall 49 of the pod chamber forms a well that is 2.847 inches deep in which the target assembly is situated. The sidewall 81 of the shield 80 covers this wall to 0.493 inches beyond the face surface of the target 47 for all target-to-substrate spacings of 2.5, 2.0 and 1.7 inches and all wafer sizes. The overall shield height is greater than the target-to-substrate spacing and is sufficient to at least partially surround the target. The sidewall 81 extends from an annular radial shoulder 82 that has in inside diameter of not more than 11.08 inches. The transition from the wall 81 to the shoulder 82 is via a radius 86 of not more than about 0.34 inches. The shoulder 82 transitions into a frusto-conical tapered section 83 via a radius 84 of about 0.09 inches and then to a flat central section 85 via a radius 87 of about 0.56 inches. The depth of the central section 85 from the plane of the shoulder 82 is 0.65 inches +/−0.02 inches. This maintains a spacing of 0.108 inches, +/−0.025 inches, from wafer holder clamp ring 31 of the wafer holder 30 when the seal ring 32, to which the wafer holder 30 is mounted and which is spring mounted to the index plate 20, is clamped against the pod chamber wall 49 by a chamber closure 33 on the opposite side of the index plate 20 from the target 47.

The shield 80 has a circular opening 88 at the center thereof which, for optimum uniformity of the coating on the wafer 100, has a diameter of 5.591+/−0.005 inches for 100 mm wafers, 6.575+/−0.005 for 125 mm wafers, 7.560+/−0.005 inches for 150 mm wafers, and 9.528+/−0.005 inches for 200 mm wafers for 2.5 inch target spacing. This diameter should not be oversized or film will deposit on the clamp ring 31, which, in addition to increasing the need to clean the clamp ring, can alter process conditions and destabilize the chamber. Further, the diameter should not be undersized or the uniformity of the deposition around the edges of the wafers being processed can be adversely affected. The optimal size of this opening 88 is larger than the corresponding opening in the wafer-holder shield 60 of the prior art. In particular, such openings 88 are expected to be in the range of 1.25–1.5 inches larger, or 20–25% larger, than for the shields 60 of the prior art. The dimensions given above of the shield 80 are particularly appropriate for a 12 inch diameter target.

To facilitate gas flow while maintaining the vacuum of the chamber 41, a plurality of vent holes or slots 79 may be provided in the shield, as illustrated in FIG. 5. The slots 79 are preferably configured in a way that restrict line-of-sight paths through the shield 80. These slots 79 are preferably located within a 90° quadrant of the cylindrical sidewall 81 that lies between holes for mounting screws 67 and faces the axis 19 of the index plate 20.

Those skilled in the art will appreciate that the present invention described above is exemplary and that aspects thereof may be varied, and that additions and modifications can be made without departing from the principles of the invention. Therefore, the following is claimed:

What is claimed is:

1. A chamber shield for a vacuum processing machine for processing a wafer of a given wafer diameter at a given target-to-substrate spacing from a sputtering target in a vertically-oriented split-plenum that is divided by a vertical index plate that rotates in a vertical plane in the plenum on a horizontal axis to index each of a plurality of wafer holders carried by the plate among a corresponding plurality of vacuum chambers of which a plurality are processing chambers that are each formed in two halves on opposite sides of the index plate by the movement toward each other of a pair of closure members that clamp against a seal ring that is mounted in an opening in the index plate and has one of the wafer holders mounted in its center, the shield comprising:

sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter the overall height of the shield is greater than the given target-to-substrate spacing.

2. The shield of claim 1 wherein:

the at least partially axially extending section is frusto-conical.

3. A chamber shield for a vacuum processing machine for processing a wafer of a given wafer diameter at a given target-to-substrate spacing from a sputtering target in a vertically-oriented split-plenum that is divided by a vertical index plate that rotates in a vertical plane in the plenum on a horizontal axis o index each of a plurality of wafer holders carried by the plate among a corresponding plurality of vacuum chambers of which a plurality are processing chambers that are each formed in two halves on opposite sides of the index plate by the movement toward each other of a pair of closure members that damn against a seal ring that is mounted in an opening in the index plate and has one o the wafer holders mounted in its center the shield comprising:

sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter:

the shield having a feature selected from the group consisting of:

the material having a thickness 0.070 inches +/−0.010 inches;

the cylindrical sidewall having a maximum outside diameter of 13.188 inches;

the cylindrical sidewall having a diameter of 13.188 inches, +0.000/−0.010 inches;

the cylindrical sidewall having an inside diameter greater than 13 inches;

the cylindrical sidewall having an axial length not greater than 2.847 inches;

the cylindrical sidewall having an axial length not more than 0.347 inches greater than the given target-to-substrate spacing;

the cylindrical sidewall having an axial length of not more than 2.12 inches;

the cylindrical sidewall having an axial length of 2.12 +0.0000/−0.02 inches;

the annular shoulder has an inside diameter of not more than 11.08 inches;

the at least partially axially-extending section having an axial length of 0.65 inches +/−0.02 inches;

the at least partially axially-extending section having an axial length of less than 0.7 inches;

the circular opening having a diameter of 5.591+/−0.005 inches for a given wafer diameter of 100 mm, 6.575+/−0.005 for a given wafer diameter of 125 mm, 7.560+/−0.005 inches for a given wafer diameter of 150 mm, and 9.528+/−0.005 inches for a given wafer diameter of 200 mm; and the shield having a plurality of vent holes or slots therein configured to lock line-of-sight paths through the shield.

4. A wafer processing machine for processing a wafer of the given wafer diameter at the given target-to-substrate spacing from a sputtering target in a chamber lined with a single piece chamber shield according claim 3, the machine comprising:

a plurality of chambers including at least one processing chamber having a door having a sputtering target supported thereon having a sputtering surface;

a vertically-oriented split-plenum;

a vertical index plate having a plurality of openings therein, each having a seal ring supported in the opening and a wafer holder supported at the center of the seal ring, the index plate being rotatable in a vertical plane in the plenum on the horizontal axis to index each of the wafer holders among the chambers;

a pair of closure members moveable toward each other that clamp against a seal ring to form a sealed chamber enclosing the wafer and the target with the sputtering surface of the target facing the wafer with the target spaced from the wafer at a given target-to-substrate spacing of from 1.7 to 2.5 inches.

5. The wafer processing machine of claim 4 wherein:

the clearance for the target, with the shield installed, is sufficient to allow adequate clearance when the door swings on hinges carrying the target into and out of the chamber.

6. The wafer processing machine of claim 4 wherein:

the clearance between the target and the cylindrical sidewall of the shield, when installed in the chamber, is at least 0.094 inches.

7. The wafer processing machine of claim 4 wherein:

the cylindrical sidewall covers the wall of the chamber to 0.493 inches beyond the sputtering surface of the target for given target-to-substrate spacings including 2.5, 2.0 and 1.7 inches.

8. A chamber shield for a vacuum processing machine for processing a wafer of a given wafer diameter at a given target-to-substrate spacing from a sputtering target in a vertically-oriented split-plenum that is divided by a vertical index plate that rotates in a vertical plane in the plenum on a horizontal axis index each of a plurality of wafer holders carried by the plate among a corresponding plurality of vacuum chambers of which a plurality are processing chambers that are each formed in two halves on opposite sides of the index plate by the movement toward each other of a pair of closure members that clamp against a seal ring that is mounted in an opening in the index plate and has one of the wafer holders mounted in its center, the shield comprising;

sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter;

the shield having at least two features selected from the group consisting of:

the material having a thickness of 0.070 inches +/−0.010 inches;

the cylindrical sidewall having a maximum outside diameter of 13.188 inches;

the cylindrical sidewall having an inside diameter greater than 13 inches;

the cylindrical sidewall having an axial length not greater than 2.847 inches;

the annular shoulder has an inside diameter of not more than 11.08 inches;

the at least partially axially-extending section having an axial length of not more than 0.67 inches;

the circular opening having a diameter of 5.591 +/−0.005 inches for a given wafer diameter of 100 mm, 6.575 +/−0.005 for a given wafer diameter of 125 mm, 7.560 +/−0.005 inches for a given wafer diameter of 150 mm, and 9.528 +/−0.005 inches for a given wafer diameter of 200 mm; and the shield having a plurality of vent holes or slots therein configured to lock line-of-sight paths through the shield and located within a 90° quadrant of the cylindrical sidewall.

9. A chamber shield for a vacuum processing machine for processing a wafer of a given wafer diameter at a given target-to-substrate spacing from a sputtering target in a vertically-oriented split-plenum that is divided by a vertical index plate that rotates in a vertical plane in the plenum on a horizontal axis index each of a plurality of wafer holders carried by the plate among a corresponding plurality of vacuum chambers of which a plurality are processing chambers that are each formed in two halves on opposite sides of the index plate by the movement toward each other of a pair of closure members that clamp against a seal ring that is mounted in an opening in the index plate and has one o the wafer holders mounted in its center the shield comprising:

sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter; and wherein:

the material has a thickness 0.070 inches +/−0.010 inches;

the cylindrical sidewall has an outside diameter of 13.188 inches, +0.000/−0.010 inches, an inside diameter greater than 13 inches, and an axial length not greater than 0.347 inches greater than the given target-to-substrate spacing;

the at least partially axially-extending section has an axial length of 0.65 inches +/−0.02 inches;

the circular opening having a diameter of 5.591+/−0.005 inches for a given wafer diameter of 100 mm, 6.575+/−0.005 for a given wafer diameter of 125 mm, 7.560+/−0.005 inches for a given wafer diameter of 150 mm, and 9.528+/−0.005 inches for a given wafer diameter of 200 mm; and the shield has a plurality of vent holes or slots therein located wit in a 90° quadrant of the cylindrical sidewall and configured to block line-of-sight paths through the shield.

10. A wafer processing machine for processing a wafer of the given wafer diameter at the given target-to-substrate spacing from a sputtering target in a chamber lined with a single piece chamber shield according claim 9, the machine comprising:

a plurality of chambers including at least one processing chamber having a door having a sputtering target supported thereon having a sputtering surface;

a vertically-oriented split-plenum;

a vertical index plate having a plurality of openings therein, each having a seal ring supported in the opening and a wafer holder supported at the center of the seal ring, the index plate being rotatable in a vertical plane in the plenum on the horizontal axis to index each of the wafer holders among the chambers;

a pair of closure members moveable toward each other that clamp against a seal ring to form a sealed chamber enclosing the wafer and the target with the sputtering surface of the target facing the wafer with the target spaced from the wafer at a given target-to-substrate spacing of from 1.7 to 2.5 inches.

11. The wafer processing machine of claim 10 wherein:

the clearance for the target, with the shield installed, is sufficient to allow adequate clearance when the door swings on hinges carrying the target into and out of th chamber.

12. The wafer processing machine of claim 10 wherein:

the clearance between the target and the cylindrical sidewall of the shield, when installed in the chamber, is at least 0.094 inches.

13. The wafer processing machine of claim 10 wherein:

the cylindrical sidewall covers the wall of the chamber to 0.493 inches beyond the sputtering surface of the target for given target-to-substrate spacings including 2.5, 2.0 and 1.7 inches.

14. A wafer processing machine for processing wafer of the given wafer diameter at the given target-to-substrate spacing from a sputtering target a chamber lined with a single piece chamber shield, the machine comprising:

a chamber shield comprising sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter;

a plurality of chambers including at least one processing chamber having a door having a sputtering target supported thereon having a sputtering surface;

a vertically-oriented split-plenum;

a vertical index plate having a plurality of openings therein, each having a seal ring supported in the opening and a wafer holder supported at the center of the seal ring, the index plate being rotatable in a vertical plane in the plenum on the horizontal axis to index each of the wafer holders among the chambers; and a pair of closure members moveable toward each other that clam against a seal ring to form a sealed chamber enclosing the wafer and the target with the sputtering surface of the target facing the wafer with the target spaced from the wafer at a given target-to-substrate spacing of from 1.7 to 2.5 inches.

15. The wafer processing machine of claim 14 wherein:
the clearance for the target, with the shield installed, is sufficient to allow adequate clearance when the door swings on hinges carrying the target into and out of the chamber.

16. The wafer processing machine of claim 14 wherein:
the clearance between the target and the cylindrical sidewall of the shield, when installed in the chamber, is at least 0.094 inches.

17. The wafer processing machine of claim 14 wherein:
the cylindrical sidewall covers the wall of the chamber to 0.493 inches beyond the sputtering surface of the target for given target-to-substrate spacings including 2.5, 2.0 and 1.7 inches.

18. A method of maintaining a vertical plenum wafer processing machine comprising a shield formed of sheet material having a generally circular cross-section and formed into an axially-extending cylindrical sidewall that turns radially inwardly into an annular shoulder that oppositely turns into an at least partially axially-extending section that further turns oppositely back radially inwardly into an annular disc having a central circular opening that is larger in diameter than the given wafer diameter in a processing chamber of a vacuum processing machine that is configured for processing a wafer of a given wafer diameter at a given target-to-substrate spacing from a sputtering target in a vertically-oriented split-plenum that is divided by a vertical index plate that rotates in a vertical plane in the plenum on horizontal axis to index each of a plurality of wafer holders carried by the plate among a corresponding plurality of vacuum chambers of which a plurality are processing chambers that are each formed in two halves on opposite sides of the index plate by the movement toward each other of a pair o closure members that clamp against a seal ring that is mounted in an opening in the index plate and has one of the wafer holders mounted in its center.

19. The method of claim 18 including:
installing the shield and replacing therewith at least two of a pod shield, gate valve shield, two corner shields, a cathode adapter shield, a spacer ring, and a wafer holder shield.

20. The method of claim 18 wherein: the cylindrical sidewall, when installed, is at least 0.032 inches from a pod chamber sidewall.

* * * * *

UNITED STATES PATENT AND TRADEMARK OFFICE
CERTIFICATE OF CORRECTION

PATENT NO. : 6,837,974 B2
DATED : January 4, 2005
INVENTOR(S) : John Laswon, Dale Irwin and Steve Chervenak It is certified that error appears in the above-identified patent and that said Letters Patent is hereby corrected as shown below:

Column 1,
Lines 12-13, read "...4,909,695 and 4,915,564, both hereby expressly i corporated herein by reference, and of the types described in U.S. Pat...." and should read -- ...4,909,695 and 4,915,564, both hereby expressly incorporated herein by reference, and of the types described in U.S. Pat.... --.
Line 21, reads "...Applicant's assignee, Tokyo Electron Limited. This..." and should read -- ...Applicants' assignee, Tokyo Electron Limited. This... --.
Line 22, reads "...application particularly relates to shield used in sputtering..." and should read -- ...application particularly relates to shields used in sputtering... --.

Column 3,
Line 21, reads "...0.010 inches. The inside diameter of the cylindrical sidewall..." and should read -- ...0.010 inch. The inside diameter of the cylindrical sidewall... --.
Line 26, reads "...chamber wall, for example, 0.094 inches. The shield cylindrical..." and should read -- ...chamber wall, for example, 0.094 inch. The shield cylindrical... --.
Line 27, reads "...cylindrical sidewall, when installed, is at least 0.032 from the..." and should read -- ... cylindrical sidewall, when installed, is at least 0.032 inch from the... --.
Line 35, reads "...planer and has in inside diameter of not more than 11.08..." and should read -- ...planer had has an inside diameter of not more than 11.08... --.
Line 38, reads "...0.67 inches, preferably by 0.65 inches +1-0.02 inches. The..." and should read -- ...0.67 inch, preferably by 0.65 inch +/-0.02 inch. The... --.
Line 40, reads "...be less than 0.7 inches. The shield, when so installed,..." and should read -- ...be less than 0.7 inch. The shield, when so installed,... --.
Line 41 reads "...maintains a spacing of 0.108 inches, +/-0.025 inches, from..." and should read -- ...maintains a spacing of 0.108 inch, +/-0.025 inch, from... --.
Lines 61-62, read "Thickness of the material is preferably 0.070 inches +1-0.010 inches. The shield is installed in machines of the..." and should read -- Thickness of the material is preferably 0.070 inch +/-0.010 inch. The shield is installed in machines of the... --.

Column 4,
Line 40, reads "...that are extend to and around a gate valve opening 43 to a..." and should read -- ...that extend to and around a gate valve opening 43 to a... --.

Column 5,
Line 65, reads "...thickness of 0.070 inches +/-0.010 inches is preferred. The..." and should read -- ...thickness of 0.070 inch +/-0.010 inch is preferred. The... --.

Column 6,
Line 4, reads "...distance of 0.032 inches is preferred. For the chamber of the..." and should read -- ...distance of 0.032 inch is preferred. For the chamber of the... --.

UNITED STATES PATENT AND TRADEMARK OFFICE
CERTIFICATE OF CORRECTION

PATENT NO.      : 6,837,974 B2
DATED           : January 4, 2005
INVENTOR(S)     : John Laswon, Dale Irwin and Steve Chervenak It is certified that error appears in the above-identified patent and that said Letters Patent is hereby corrected as shown below:

Column 6 (cont'd),
Lines 7-8, read "...of 13.188 inches, with tolerances of +0.000 inches and -0.010 inches, where the material is of the thickness referred..." and should read -- ...of 13.188 inches, with tolerances of +0.000 inch and -0.010 inch, where the material is of the thickness referred... --.
Line 17, reads "...pod chamber wall, for example of 0.094 inches, thereby..." and should read -- ...pod chamber wall, for example of 0.094 inch, thereby... --.
Lines 21-22, read "...that can affect the quality of the process (new paragraph) performed on the wafer." and should read -- ...that can affect the quality of the process performed on the wafer. (NO new paragraph) --.
Line 26, reads "...covers this wall to 0.493 inches beyond the face surface of..." and should read -- ...covers this wall to 0.493 inch beyond the face surface of... --.
Line 31, reads "...extends from an annular radial shoulder 82 that has in inside..." and should read -- ...extends from an annular radial shoulder 82 that has an inside... --.
Line 34, reads "...than about 0.34 inches. The shoulder 82 transitions into a..." and should read -- ...than about 0.34 inch. The shoulder 82 transitions into a... --.
Line 36, reads "...0.09 inches and then to a flat central section 85 via a radius..." and should read -- ...0.09 inch and then to a flat central section 85 via a radius... --.
Line 37, reads "...87 of about 0.56 inches. The depth of the central section 85..." and should read -- ...87 of about 0.56 inch. The depth of the central section 85... --.
Lines 38-40, read "...from the plane of the shoulder 82 is 0.65 inches +/-0.02 inches. This maintains a spacing of 0.108 inches, +/-0.025 inches, from wafer holder clamp ring 31 of the wafer holder..." and should read -- ...from the plane of the shoulder 82 is 0.65 inch +/-0.02 inch. This maintains a spacing of 0.108 inch, +/-0.025 inch, from wafer holder clamp ring 31 of the wafer holder... --.

Column 7,
Line 32, reads "...the given wafer diameter the overall height of the shield..." and should read -- ...the given wafer diameter, the overall height of the shield... --.
Line 42, reads "...a horizontal axis o index each of a plurality of wafer holders..." and should read -- ...a horizontal axis to index each of a plurality of wafer holders... --.
Line 47, reads "...of closure members that damn against a seal ring that is..." and should read -- ...of closure members that clamp against a seal ring that is... --.
Line 48, reads "...mounted in an opening in the index plate and has one o the..." and should read -- ...mounted in an opening in the index plate and has one of the... --.
Line 49, reads "...wafer holders mounted in its center the shield comprising:..." and should read -- ...wafer holders mounted in its center, the shield comprising: ... --.
Line 57, reads "...the given wafer diameter:" and should read -- ...the given wafer diameter; --.

UNITED STATES PATENT AND TRADEMARK OFFICE
CERTIFICATE OF CORRECTION

PATENT NO. : 6,837,974 B2
DATED : January 4, 2005
INVENTOR(S) : John Laswon, Dale Irwin and Steve Chervenak It is certified that error appears in the above-identified patent and that said Letters Patent is hereby corrected as shown below:

Column 7 (cont'd),
Lines 60-61, read "...the material having a thickness 0.070 inches +/-0.010 inches;" and should read -- ...the material having a thickness 0.070 inch +/-0.010 inch; --.
Line 65, reads "...inches, +0.000/-0.010 inches;" and should read -- ...inches, +0.000/-0.010 inch; --.

Column 8,
Line 4, reads "...than 0.347 inches greater than the given target-to-substrate..." and should read -- ...than 0.347 inch greater than the given target-to-substrate... --.
Line 13, reads "...axial length of 0.65 inches +/-0.02 inches;" and should read -- ...axial length of 0.65 inch +/-0.02 inch; --.
Line 15, reads "...axial length of less than 0.7 inches;" and should read -- ...axial length of less than 0.7 inch; --.
Line 23, reads "...therein configured to lock line-of-sight paths through..." and should read -- ...therein configured to block line-of-sight paths through... --.
Line 28, reads "...single piece chamber shield according claim 3, the machine..." and should read -- ...single piece chamber shield according to claim 3, the machine... --.
Line 55, reads "...least 0.094 inches." and should read -- ...least 0.094 inch. --.
Line 58, reads "...0.493 inches beyond the sputtering surface of the target..." and should read -- ...0.493 inch beyond the sputtering surface of the target... --.
Line 66, reads "... a horizontal axis index each of a plurality of wafer holders..." and should read -- ... a horizontal axis to index each of a plurality of wafer holders... --.

Column 9,
Line 6, reads "... wafer holders mounted in its center, the shield comprising;" and should read -- wafer holders mounted in its center, the shield comprising: --.
Lines 17-18, read "...the material having a thickness of 0.070 inches +/-0.010 inches;" and should read -- ...the material having a thickness of 0.070 inch +/-0.010 inch; --.
Line 28 reads "...axial length of not more than 0.67 inches;" and should read -- ...axial length of not more than 0.67 inch; --.
Line 36, reads "...therein configured to lock line-of-sight paths through..." and should read -- ...therein configured to block line-of-sight paths through... --.
Line 44, reads "...a horizontal axis index each of a plurality of wafer holders..." and should read -- ... a horizontal axis to index each of a plurality of wafer holders... --.
Line 50, reads "...mounted in an opening in the index plate and has one o the..." and should read -- ...mounted in an opening in the index plate and has one of the... --.
Line 51, reads "...wafer holders mounted in its center the shield comprising:" and should read -- ...wafer holders mounted in its center, the shield comprising: --.
Line 60, reads "...the material has a thickness 0.070 inches +/-0.010 inches;" and should read -- ...the material has a thickness 0.070 inch +/-0.010 inch; --.

UNITED STATES PATENT AND TRADEMARK OFFICE
CERTIFICATE OF CORRECTION

PATENT NO.    : 6,837,974 B2
DATED         : January 4, 2005
INVENTOR(S)   : John Laswon, Dale Irwin and Steve Chervenak It is certified that error appears in the above-identified patent and that said Letters Patent is hereby corrected as shown below:

Column 9 (cont'd),
Line 62, reads "...inches, +0.000/-0.010 inches, an inside diameter..." and should read -- ...inches, +0.000/-0.010 inch, an inside diameter... --.
Line 64, reads "...than 0.347 inches greater than the given target-to-substrate..." and should read -- ...than 0.347 inch greater than the given target-to-substrate... --.
Line 67, reads "...length of 0.65 inches +/-0.02 inches:" and should read -- ...length of 0.65 inch +/-0.02 inch: --.

Column 10,
Line 8, reads "...located wit in a 90° quadrant of the cylindrical sidewall..." and should read -- ...located within a 90° quadrant of the cylindrical sidewall... --.
Line 14, reads "...single piece chamber shield according claim 9, the machine..." and should read -- ...single piece chamber shield according to claim 9, the machine... --.
Lines 36-37, read "...swings on hinges carrying the target into and out of th chamber." and should read -- ...swings on hinges carrying the target into and out of the chamber. --.
Line 41, reads "...least 0.094 inches." and should read -- ...least 0.094 inch. --.
Line 44, reads "...0.493 inches beyond the sputtering surface of the target..." and should read -- ...0.493 inch beyond the sputtering surface of the target... --.
Line 47, reads "14. A wafer processing machine for processing wafer of..." and should read -- 14. A wafer processing machine for processing a wafer of... --.
Line 49, reads "...spacing from a sputtering target a chamber lined with a..." and should read -- ...spacing from a sputtering target in a chamber lined with a... --.

Column 11,
Line 4, reads "...that clam against a seal ring to form a sealed chamber..." and should read -- ... that clamp against a seal ring to form a sealed chamber... --.
Line 17, reads "...least 0.094 inches." and should read -- ...least 0.094 inch. --.
Line 20, reads "...0.493 inches beyond the sputtering surface of the target..." and should read -- ...0.493 inch beyond the sputtering surface of the target... --.

UNITED STATES PATENT AND TRADEMARK OFFICE
CERTIFICATE OF CORRECTION

PATENT NO. : 6,837,974 B2
DATED : January 4, 2005
INVENTOR(S) : John Laswon, Dale Irwin and Steve Chervenak It is certified that error appears in the above-identified patent and that said Letters Patent is hereby corrected as shown below:

Column 12,
Lines 9-10, read "...index plate that rotates in a vertical plane in the plenum on horizontal axis to index each of a plurality of wafer holders..." and should read -- "...index plate that rotates in a vertical plane in the plenum on a horizontal axis to index each of a plurality of wafer holders... --.
Lines 14-15, read "...the index plate by the movement toward each other of a pair o closure members that clamp against a seal ring that is ..." and should read -- "...the index plate by the movement toward each other of a pair of closure members that clamp against a seal ring that is... --.
Line 20, reads "...a pod shield, gate valve shield, two corner shields, a..." and should read -- ...a pod shield, a gate valve shield, two corner shields, a... --.
Line 24, reads "...sidewall, when installed, is at least 0.032 inches from a pod..." and should read -- ...sidewall, when installed, is at least 0.032 inch from a pod... --.

Signed and Sealed this

Fifth Day of July, 2005

JON W. DUDAS
*Director of the United States Patent and Trademark Office*

UNITED STATES PATENT AND TRADEMARK OFFICE
CERTIFICATE OF CORRECTION

PATENT NO. : 6,837,974 B2
DATED : January 4, 2005
INVENTOR(S) : John Lawson, Dale Irwin and Steve Chervenak It is certified that error appears in the above-identified patent and that said Letters Patent is hereby corrected as shown below:

Column 3,
Line 38, "...0.67 inches, preferably by 0.65 inches +1-0.02 inches. The..." should read -- ...0.67 inch, preferably by 0.65 inch +/-0.02 inch. The... --.
Lines 61-62, "Thickness of the material is preferably 0.070 inches +1-0.010 inches. The shield is installed in machines of the..." should read -- Thicknesss of the material is preferably 0.070 inch +/-0.010 inch. The shield is installed in machines of the... --.

Signed and Sealed this

Seventeenth Day of January, 2006

JON W. DUDAS
*Director of the United States Patent and Trademark Office*

UNITED STATES PATENT AND TRADEMARK OFFICE
CERTIFICATE OF CORRECTION

PATENT NO.      : 6,837,974 B2
DATED           : January 4, 2005
INVENTOR(S)     : John Lawson, Dale Irwin and Steve Chervenak It is certified that error appears in the above-identified patent and that said Letters Patent is hereby corrected as shown below:

Column 1,
Lines 12-13, read "...4,909,695 and 4,915,564, both hereby expressly i corporated herein by reference, and of the types described in U.S. Pat...." and should read -- ...4,909,695 and 4,915,564, both hereby expressly incorporated herein by reference, and of the types described in U.S. Pat.... --.
Line 21, reads "...Applicant's assignee, Tokyo Electron Limited. This..." and should read -- ...Applicants' assignee, Tokyo Electron Limited. This... --.
Line 22, reads "...application particularly relates to shield used in sputtering..." and should read -- ...application particularly relates to shields used in sputtering... --.

Column 3,
Line 21, reads "...0.010 inches. The inside diameter of the cylindrical sidewall..." and should read -- ...0.010 inch. The inside diameter of the cylindrical sidewall... --.
Line 26, reads "...chamber wall, for example, 0.094 inches. The shield cylindrical..." and should read -- ...chamber wall, for example, 0.094 inch. The shield cylindrical... --.
Line 27, reads "...cylindrical sidewall, when installed, is at least 0.032 from the..." and should read -- ... cylindrical sidewall, when installed, is at least 0.032 inch from the... --.
Line 35, reads "...planer and has in inside diameter of not more than 11.08..." and should read -- ...planer had has an inside diameter of not more than 11.08... --.
Line 38, reads "...0.67 inches, preferably by 0.65 inches +/-0.02 inches. The..." and should read -- ...0.67 inch, preferably by 0.65 inch +/-0.02 inch. The... --.
Line 40, reads "...be less than 0.7 inches. The shield, when so installed,..." and should read -- ...be less than 0.7 inch. The shield, when so installed,... --.
Line 41 reads "...maintains a spacing of 0.108 inches, +/-0.025 inches, from..." and should read -- ...maintains a spacing of 0.108 inch, +/-0.025 inch, from... --.
Lines 61-62, read "Thickness of the material is preferably 0.070 inches +/-0.010 inches. The shield is installed in machines of the..." and should read -- Thickness of the material is preferably 0.070 inch +/-0.010 inch. The shield is installed in machines of the... --.

Column 4,
Line 40, reads "...that are extend to and around a gate valve opening 43 to a..." and should read -- ...that extend to and around a gate valve opening 43 to a... --.

Column 5,
Line 65, reads "...thickness of 0.070 inches +/-0.010 inches is preferred. The..." and should read -- ...thickness of 0.070 inch +/-0.010 inch is preferred. The... --.

Column 6,
Line 4, reads "...distance of 0.032 inches is preferred. For the chamber of the..." and should read -- ...distance of 0.032 inch is preferred. For the chamber of the... --.

UNITED STATES PATENT AND TRADEMARK OFFICE
CERTIFICATE OF CORRECTION

PATENT NO. : 6,837,974 B2
DATED : January 4, 2005
INVENTOR(S) : John Lawson, Dale Irwin and Steve Chervenak It is certified that error appears in the above-identified patent and that said Letters Patent is hereby corrected as shown below:

Column 6 (cont'd),
Lines 7-8, read "...of 13.188 inches, with tolerances of +0.000 inches and -0.010 inches, where the material is of the thickness referred..." and should read -- ...of 13.188 inches, with tolerances of +0.000 inch and -0.010 inch, where the material is of the thickness referred... --.
Line 17, reads "...pod chamber wall, for example of 0.094 inches, thereby..." and should read -- ...pod chamber wall, for example of 0.094 inch, thereby... --.
Lines 21-22, read "...that can affect the quality of the process (new paragraph) performed on the wafer." and should read -- ...that can affect the quality of the process performed on the wafer. (NO new paragraph) --.
Line 26, reads "...covers this wall to 0.493 inches beyond the face surface of..." and should read -- ...covers this wall to 0.493 inch beyond the face surface of... --.
Line 31, reads "...extends from an annular radial shoulder 82 that has in inside..." and should read -- ...extends from an annular radial shoulder 82 that has an inside... --.
Line 34, reads "...than about 0.34 inches. The shoulder 82 transitions into a..." and should read -- ...than about 0.34 inch. The shoulder 82 transitions into a... --.
Line 36, reads "...0.09 inches and then to a flat central section 85 via a radius..." and should read -- ...0.09 inch and then to a flat central section 85 via a radius... --.
Line 37, reads "...87 of about 0.56 inches. The depth of the central section 85..." and should read -- ...87 of about 0.56 inch. The depth of the central section 85... --.
Lines 38-40, read "...from the plane of the shoulder 82 is 0.65 inches +/-0.02 inches. This maintains a spacing of 0.108 inches, +/-0.025 inches, from wafer holder clamp ring 31 of the wafer holder..." and should read -- ...from the plane of the shoulder 82 is 0.65 inch +/-0.02 inch. This maintains a spacing of 0.108 inch, +/-0.025 inch, from wafer holder clamp ring 31 of the wafer holder... --.

Column 7,
Line 32, reads "...the given wafer diameter the overall height of the shield..." and should read -- ...the given wafer diameter, the overall height of the shield... --.
Line 42, reads "...a horizontal axis o index each of a plurality of wafer holders..." and should read -- ...a horizontal axis to index each of a plurality of wafer holders... --.
Line 47, reads "...of closure members that damn against a seal ring that is..." and should read -- ...of closure members that clamp against a seal ring that is... --.
Line 48, reads "...mounted in an opening in the index plate and has one o the..." and should read -- ...mounted in an opening in the index plate and has one of the... --.
Line 49, reads "...wafer holders mounted in its center the shield comprising:..." and should read -- ...wafer holders mounted in its center, the shield comprising: ... --.
Line 57, reads "...the given wafer diameter:" and should read -- ...the given wafer diameter; --.

UNITED STATES PATENT AND TRADEMARK OFFICE
CERTIFICATE OF CORRECTION

PATENT NO.  : 6,837,974 B2
DATED       : January 4, 2005
INVENTOR(S) : John Lawson, Dale Irwin and Steve Chervenak It is certified that error appears in the above-identified patent and that said Letters Patent is hereby corrected as shown below:

Column 7 (cont'd),
Lines 60-61, read "...the material having a thickness 0.070 inches +/-0.010 inches;" and should read -- ...the material having a thickness 0.070 inch +/-0.010 inch; --.
Line 65, reads "...inches, +0.000/-0.010 inches;" and should read -- ...inches, +0.000/-0.010 inch; --.

Column 8,
Line 4, reads "...than 0.347 inches greater than the given target-to-substrate..." and should read -- ...than 0.347 inch greater than the given target-to-substrate... --.
Line 13, reads "...axial length of 0.65 inches +/-0.02 inches;" and should read -- ...axial length of 0.65 inch +/-0.02 inch; --.
Line 15, reads "...axial length of less than 0.7 inches;" and should read -- ...axial length of less than 0.7 inch; --.
Line 23, reads "...therein configured to lock line-of-sight paths through..." and should read -- ...therein configured to block line-of-sight paths through... --.
Line 28, reads "...single piece chamber shield according claim 3, the machine..." and should read -- ...single piece chamber shield according to claim 3, the machine... --.
Line 55, reads "...least 0.094 inches." and should read -- ...least 0.094 inch. --.
Line 58, reads "...0.493 inches beyond the sputtering surface of the target..." and should read -- ...0.493 inch beyond the sputtering surface of the target... --.
Line 66, reads "... a horizontal axis index each of a plurality of wafer holders..." and should read -- ... a horizontal axis to index each of a plurality of wafer holders... --.
Column 9,
Line 6, reads "... wafer holders mounted in its center, the shield comprising;" and should read -- wafer holders mounted in its center, the shield comprising: --.
Lines 17-18, read "...the material having a thickness of 0.070 inches +/-0.010 inches;" and should read -- ...the material having a thickness of 0.070 inch +/-0.010 inch; --.
Line 28 reads "...axial length of not more than 0.67 inches;" and should read -- ...axial length of not more than 0.67 inch; --.
Line 36, reads "...therein configured to lock line-of-sight paths through..." and should read -- ...therein configured to block line-of-sight paths through... --.
Line 44, reads "...a horizontal axis index each of a plurality of wafer holders..." and should read -- ... a horizontal axis to index each of a plurality of wafer holders... --.
Line 50, reads "...mounted in an opening in the index plate and has one o the..." and should read -- ...mounted in an opening in the index plate and has one of the... --.
Line 51, reads "...wafer holders mounted in its center the shield comprising:" and should read -- ...wafer holders mounted in its center, the shield comprising: --.
Line 60, reads "...the material has a thickness 0.070 inches +/-0.010 inches;" and should read -- ...the material has a thickness 0.070 inch +/-0.010 inch; --.

UNITED STATES PATENT AND TRADEMARK OFFICE
CERTIFICATE OF CORRECTION

PATENT NO.    : 6,837,974 B2
DATED         : January 4, 2005
INVENTOR(S)   : John Lawson, Dale Irwin and Steve Chervenak It is certified that error appears in the above-identified patent and that said Letters Patent is hereby corrected as shown below:

Column 9 (cont'd),
Line 62, reads "...inches, +0.000/-0.010 inches, an inside diameter..." and should read -- ...inches, +0.000/-0.010 inch, an inside diameter... --.
Line 64, reads "...than 0.347 inches greater than the given target-to-substrate..." and should read -- ...than 0.347 inch greater than the given target-to-substrate... --.
Line 67, reads "...length of 0.65 inches +/-0.02 inches:" and should read -- ...length of 0.65 inch +/-0.02 inch: --.

Column 10,
Line 8, reads "...located wit in a 90° quadrant of the cylindrical sidewall..." and should read -- ...located within a 90° quadrant of the cylindrical sidewall... --.
Line 14, reads "...single piece chamber shield according claim 9, the machine..." and should read -- ...single piece chamber shield according to claim 9, the machine... --.
Lines 36-37, read "...swings on hinges carrying the target into and out of th chamber." and should read -- ...swings on hinges carrying the target into and out of the chamber. --.
Line 41, reads "...least 0.094 inches." and should read -- ...least 0.094 inch. --.
Line 44, reads "...0.493 inches beyond the sputtering surface of the target..." and should read -- ...0.493 inch beyond the sputtering surface of the target... --.
Line 47, reads "14. A wafer processing machine for processing wafer of..." and should read -- 14. A wafer processing machine for processing a wafer of... --.
Line 49, reads "...spacing from a sputtering target a chamber lined with a..." and should read -- ...spacing from a sputtering target in a chamber lined with a... --.

Column 11,
Line 4, reads "...that clam against a seal ring to form a sealed chamber..." and should read -- ... that clamp against a seal ring to form a sealed chamber... --.
Line 17, reads "...least 0.094 inches." and should read -- ...least 0.094 inch. --.
Line 20, reads "...0.493 inches beyond the sputtering surface of the target..." and should read -- ...0.493 inch beyond the sputtering surface of the target... --.

UNITED STATES PATENT AND TRADEMARK OFFICE
CERTIFICATE OF CORRECTION

PATENT NO. : 6,837,974 B2
DATED : January 4, 2005
INVENTOR(S) : John Lawson, Dale Irwin and Steve Chervenak It is certified that error appears in the above-identified patent and that said Letters Patent is hereby corrected as shown below:

Column 12,
Lines 9-10, read "...index plate that rotates in a vertical plane in the plenum on horizontal axis to index each of a plurality of wafer holders..." and should read -- "...index plate that rotates in a vertical plane in the plenum on a horizontal axis to index each of a plurality of wafer holders... --.
Lines 14-15, read "...the index plate by the movement toward each other of a pair o closure members that clamp against a seal ring that is ..." and should read -- "...the index plate by the movement toward each other of a pair of closure members that clamp against a seal ring that is... --.
Line 20, reads "...a pod shield, gate valve shield, two corner shields, a..." and should read -- ...a pod shield, a gate valve shield, two corner shields, a... --.
Line 24, reads "...sidewall, when installed, is at least 0.032 inches from a pod..." and should read -- ...sidewall, when installed, is at least 0.032 inch from a pod... --.

This certificate supersedes Certificate of Correction issued July 5, 2005.

Signed and Sealed this

Seventh Day of February, 2006

JON W. DUDAS
*Director of the United States Patent and Trademark Office*